United States Patent [19]
Ishii et al.

[11] Patent Number: 5,293,336
[45] Date of Patent: Mar. 8, 1994

[54] SEMICONDUCTOR MEMORY DEVICE AND METHOD FOR MANUFACTURING THE SAME

[75] Inventors: Takeaki Ishii; Satoshi Maeda, both of Ooita, Japan

[73] Assignee: Kabushiki Kaisha Toshiba, Kawasaki, Japan

[21] Appl. No.: 784,519

[22] Filed: Oct. 29, 1991

[30] Foreign Application Priority Data

Oct. 30, 1990 [JP] Japan .................................. 2-290844

[51] Int. Cl.$^5$ ............................................. H01L 21/72
[52] U.S. Cl. ......................................... 365/149; 437/52; 437/60; 437/43
[58] Field of Search .................... 365/149; 437/43, 60

[56] References Cited

U.S. PATENT DOCUMENTS 5,057,449 10/1991 Lowrey et al. ..................... 437/60
5,083,172 1/1992 Kiyono ............................. 357/23.6
5,104,819 4/1992 Feiberger et al. ..................... 437/43

Primary Examiner—Eugene R. LaRoche
Assistant Examiner—Viet Q. Nguyen
Attorney, Agent, or Firm—Finnegan, Henderson, Farabow, Garrett & Dunner

[57] ABSTRACT

A semiconductor memory device has a memory cell composed of a select MOS transistor and information storage capacitor and a peripheral circuit composed of a MOS transistor formed at a peripheral side of the memory cell, these transistors being formed in the surface portion of a first conductivity type semiconductor substrate. In the semiconductor memory device, the gate oxide film of the select MOS transistor is different in thickness from the gate oxide film of the MOS transistor of the peripheral circuit, the gate electrodes of these transistors being simultaneously formed.

1 Claim, 3 Drawing Sheets

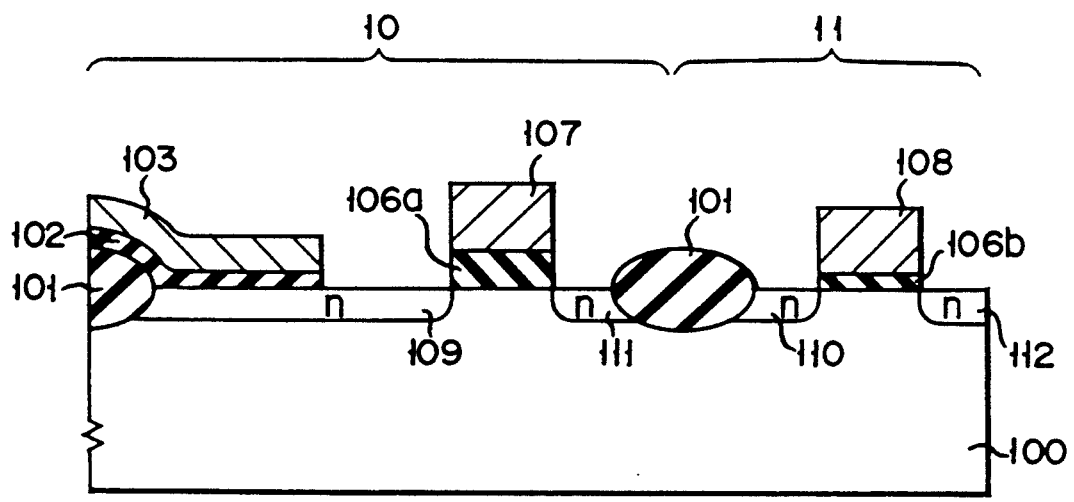
F I G. 2

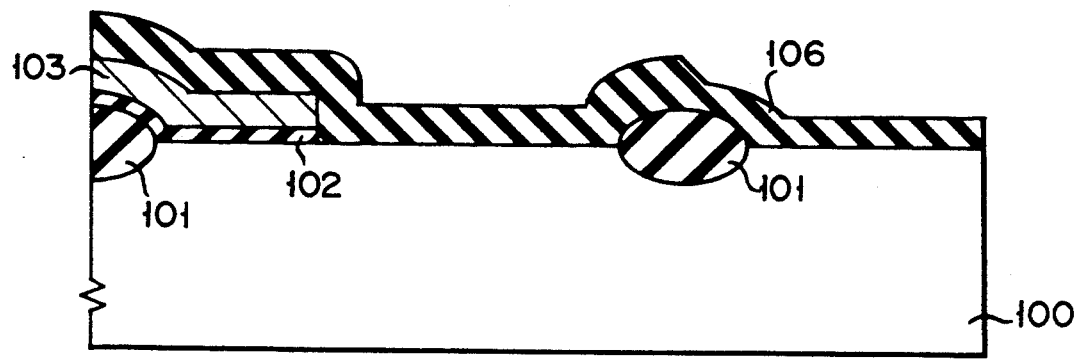
F I G. 5
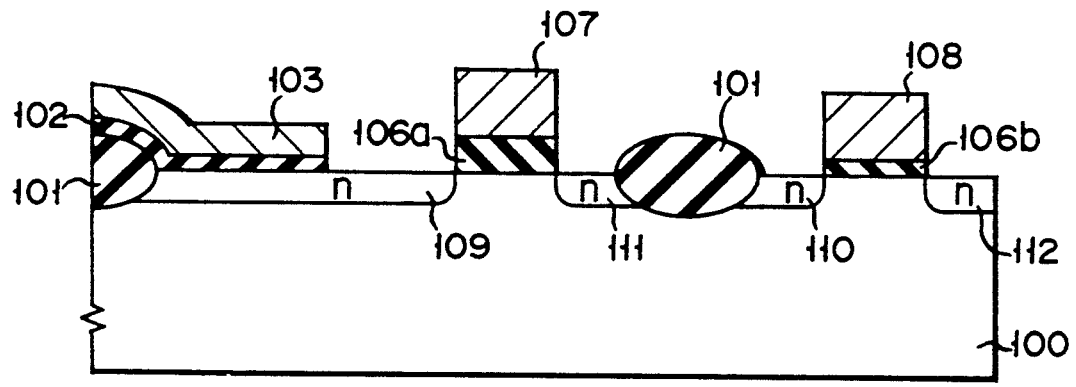
F I G. 6

SEMICONDUCTOR MEMORY DEVICE AND METHOD FOR MANUFACTURING THE SAME

BACKGROUND OF THE INVENTION

1. Field of the Invention

The present invention relates to a semiconductor memory device and a method for manufacturing the same.

2. Description of the Related Art

Conventionally, a semiconductor memory device, such as a dynamic RAM, is constructed as shown in FIG. 1 and a gate electrode 1 of a select MOS transistor constitutes a word line of the memory cell.

At the time of a normal write operation, a voltage VCC+2VTH is applied to the word line 2 to turn the select MOS transistor ON. A bit "1" or "0" is written into a bit line 3. At a time of the read operation, the voltage VCC+2VTH is applied to the word line 2 to turn the select MOS transistor ON, reading out information from a capacitor 4 for information storage. It is to be noted that the increase in the voltage on the word line 2 is effected to increase a write or a read margin and to do so in an internal circuit.

The aforementioned conventional dynamic RAM has the following drawbacks.

When the voltage VTH on the select MOS transistor is, for example, 1.5 V, the voltage on the word line 2 becomes $$5\ V(VCC) + (2 \times 1.5\ V) = 8\ V$$

When a gate oxide film 5 of the MOS transistor is, for example, 200 Å, it is less degenerated/destroyed under an electric field of 4 MV/cm applied to the gate electrode 1.

At a burn-in time in which the device is screened for initial defects, a test is made generally with a power supply voltage VCC raised. In the case of, for example, a 8 V power supply voltage VCC applied, a voltage on the word line 2 becomes 11 V and an electric field of 5.5 MV/cm is applied to the gate electrode 1 of the MOS transistor, causing degeneration and breakage of the gate oxide film 5. This leads to a lowered yield and lowered reliability.

If, against these drawbacks, the gate oxide film 5 is thickened so as to lower the electric field applied to the word line 2, the drive capability of the transistor at the peripheral circuit side is lowered, thus lowering an operation margin, such as the speed margin.

SUMMARY OF THE INVENTION

It is accordingly the object of the present invention to provide a semiconductor memory device, and a method for manufacturing the same, which involves no degeneration or breakage and which prevents any fall in yield or in reliability.

The semiconductor memory device of the present invention includes a memory cell comprised of a select MOS transistor and capacitor for information storage and a MOS transistor at a peripheral circuit side, these MOS transistors being formed in and on the surface portion of a semiconductor substrate.

Further, in the semiconductor memory device of the invention and, the gate oxide film of the select MOS transistor is different in thickness from that of the latter MOS transistor, these transistors having gate electrodes formed simultaneously.

A method for the manufacture of a semiconductor memory device according to the present invention is provided which comprises the steps of:

forming element insolating areas in and on the surface of a first conductivity type semiconductor substrate;

forming a first insulating film over the surface of the semiconductor substrate at an area defined by the element isolation areas and forming a capacitor electrode on the first insulating film;

forming a second insulating film on the capacitor electrode and predetermined select MOS transistor area and a MOS transistor area of a peripheral circuit, these transistors area being formed in and on the surface portion of the semiconductor substrate;

removing the second insulating film over the MOS transistor area of the peripheral circuit;

forming a third insulating film over the select MOS transistor area and MOS transistor area of the peripheral circuit; and simultaneously forming a gate electrode over the select MOS transistor area and MOS transistor area of the peripheral circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view showing a semiconductor memory device according to one embodiment of the present invention;

FIG. 5 is a cross-sectional view showing another step of the method for manufacturing the semiconductor memory device according to the embodiment of the present invention; and FIG. 6 is a cross-sectional view showing another step of the method for manufacturing the semiconductor memory device of the present invention.

DETAILED DESCRIPTION OF THE PREFERRED EMBODIMENTS

Figure 1:
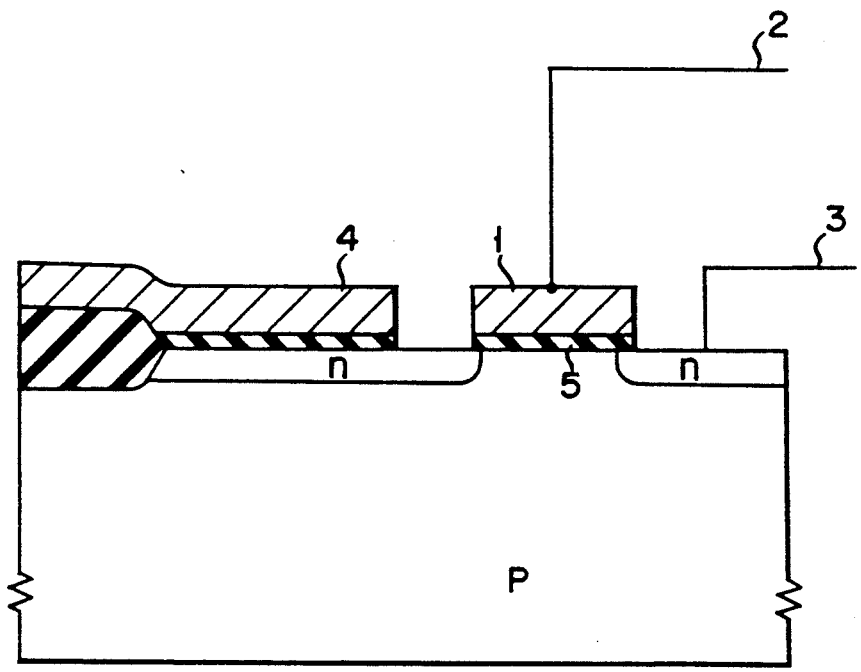
FIG. 1 is a cross-sectional view showing a conventional semiconductor memory device.

FIG. 2 shows a cross-sectional view of a semiconductor memory device. In FIG. 2, reference numeral 100 shows a first conductivity type semiconductor substrate, that is, a p type semiconductor substrate. Two field oxidation films 101 are selectively formed on the surface portion of the semiconductor substrate 100. An area in and on the surface portion of the semiconductor substrate defined between the field oxidation films 101 provides a transistor area 10 of a memory cell, while an area in and on the surface portion of the semiconductor substrate defined between the right-side field oxidation film 101 and a peripheral portion provides a transistor area 11 of a peripheral circuit.

An oxide film 102 and capacitor electrode 103 are sequentially deposited, in that order, over the left-side field oxidation film 101 and the adjacent surface portion of the semiconductor substrate, the capacitor electrode 103 serving as a capacitor for information storage. A gate oxide film 106a and gate oxide film 106b are formed on areas, of the memory cell 10 and peripheral circuit 11, respectively. In this case, the gate oxide film 106a is different from, or greater than, the gate oxide film 106b in terms of thickness. Gate electrodes 107 and 108 are formed on the gate oxide films 106a and 106b, respectively.

A source region 109 is formed in the surface portion of the semiconductor substrate 100 is located between the left-side field oxidation film 101 and the gate oxide film 106a. A source region 110 is formed in the surface portion of the semiconductor substrate 100 is located between the right-side field oxidation film 101 and the gate oxide film 106b.

A drain region 111 is formed in the surface portion of the semiconductor substrate 100 is situated between the gate oxide film 106a and the right-side field oxidation film 101. A drain region 112 is formed in the surface portion of the semiconductor substrate 100 and is situated between the gate oxide film 106b and the peripheral circuit side.

The method for the manufacture of the semiconductor memory device according to the present invention will be explained below.

Figure 3:
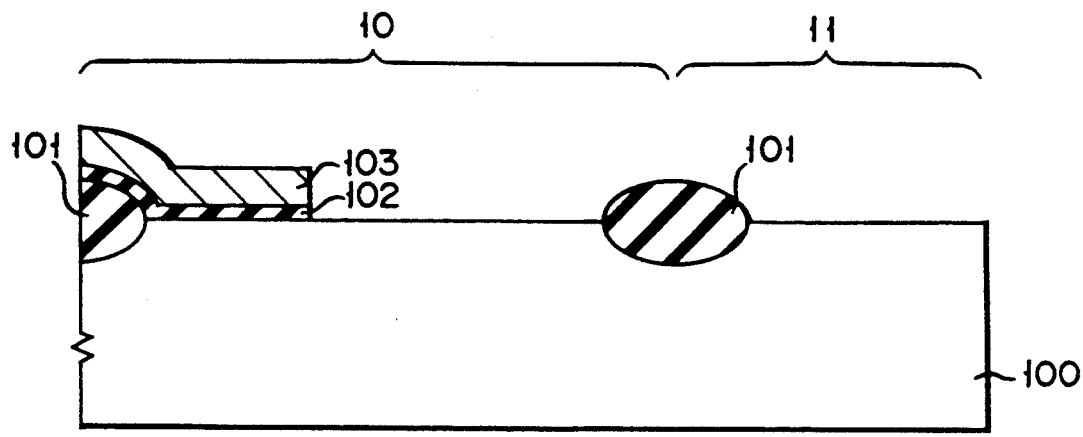
FIG. 3 is a cross-sectional view showing one step of a method for manufacturing the semiconductor memory device according to an embodiment of the present invention.

As shown in FIG. 3, a field oxidation film 101 and about 150 Å-thick oxide film 102 are sequentially formed over a p type semiconductor substrate 100. After a phosphorus (p)-doped polysilicon layer has been deposited over the resultant structure, a capacitor electrode 103 is selectively provided and the surface portion of the p type semiconductor substrate 100 is exposed at a transistor area 10 of the memory cell and a transistor area 11 of a peripheral circuit.

Figure 4:
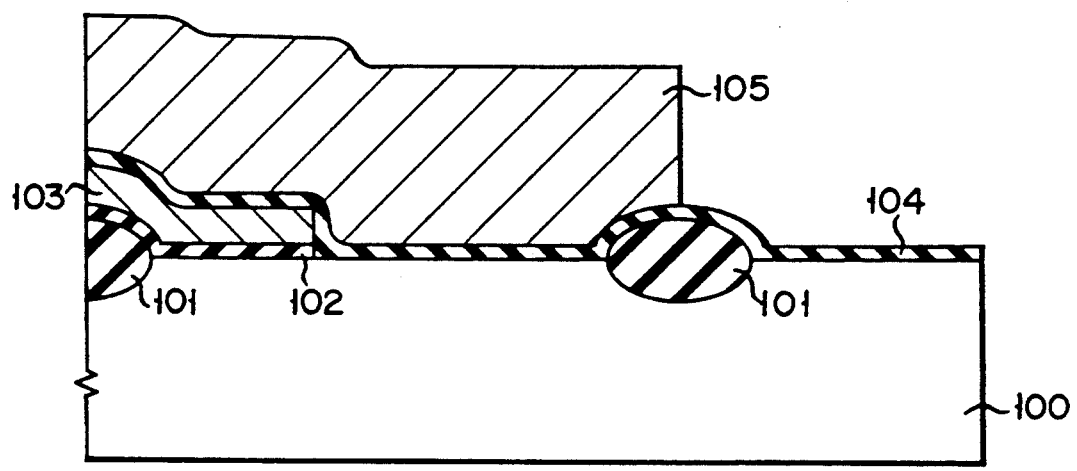
FIG. 4 is a cross-sectional view showing another step of the method for manufacturing the semiconductor memory device according to the embodiment of the present invention.

As shown in FIG. 4, an about 100 Å-thick gate oxide film 104 is formed on the exposed surface of the p type semiconductor substrate 100 and then a resist layer is formed by a photoetching method on the transistor area 10 of the memory cell.

As shown in FIG. 5, only the gate oxide film 104 on the transistor area 11 of the peripheral circuit side is etched with the resist layer 105 used as a mask and then the resist layer 105 is etched away.

An about 200 Å-thick gate oxide film 106 is formed over the resultant structure. As a result, an about 270 Å-thick gate oxide film 106a is formed over the transistor area 10 of the memory cell and an about 200 Å-thick gate oxide film 106b is formed over the transistor area 11 of the peripheral circuit (FIG. 6).

Finally, gate electrodes 107 and 108 of the memory cell and peripheral circuit are formed over the gate oxide films 106a and 106b, respectively, as shown in FIG. 6 and, with the gate electrodes 107, 108 and capacitor electrode 103 used as masks, an N type impurity is implanted into the surface portions of the semiconductor substrate to provide source regions 109, 110 and drain regions 111 and 112. A MOS transistor is formed in this way.

It is to be noted that the arrangement shown in FIG. 6 is the same as that shown in FIG. 2. The oxide film as set out above is an insulating film.

Although, in the aforementioned embodiment, the oxide film on the capacitor electrode 103 has been explained as being formed simultaneously with the formation of the gate oxide film 106, a separate step may be made as a step for forming the oxide film over the capacitor electrode 103.

As set out above, according to the present invention, if the voltage on a word line is raised, the gate oxide film is not deteriorated or destroyed which in conventional semiconductor devices caused a reduced yield and reduced reliability.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
a memory cell composed of a select MOS transistor and an information storage capacitor both formed on a surface portion of a first conductivity type semiconductor region of a substrate and a peripheral circuit composed of a MOS transistor formed on the surface portion of the semiconductor region of the substrate at a peripheral portion of the memory cell, wherein a thickness of a gate oxide film of the MOS transistor of the peripheral circuit is between a thickness of a gate oxide film of the select MOS transistor and a thickness of an insulating film of the information storage capacitor.

* * * * *